US011097318B2

(12) United States Patent
Teng et al.

(10) Patent No.: US 11,097,318 B2
(45) Date of Patent: *Aug. 24, 2021

(54) CUP WASH DISK WITH SHIMS

(71) Applicant: Taiwan Semiconductor Manufacturing Co., Ltd., Hsin-Chu (TW)

(72) Inventors: Hua-Kuang Teng, Qionglin Township (TW); Yu-Xiang Lin, Zhubei (TW); Tien-Zeng Fang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/929,545

(22) Filed: Jul. 15, 2020

(65) Prior Publication Data

US 2020/0338605 A1 Oct. 29, 2020

Related U.S. Application Data

(60) Continuation of application No. 16/360,354, filed on Mar. 21, 2019, now Pat. No. 10,717,114, which is a division of application No. 14/995,305, filed on Jan. 14, 2016, now Pat. No. 10,265,735.

(51) Int. Cl.
*B08B 3/02* (2006.01)
*B08B 3/04* (2006.01)
*G03F 7/16* (2006.01)

(52) U.S. Cl.
CPC .................. *B08B 3/02* (2013.01); *B08B 3/04* (2013.01); *G03F 7/162* (2013.01)

(58) Field of Classification Search
None
See application file for complete search history.

(56) References Cited

U.S. PATENT DOCUMENTS

| 5,312,487 A | 5/1994 | Akimoto et al. |
| 5,871,584 A | 2/1999 | Tateyama et al. |
| 5,947,136 A * | 9/1999 | Abras ..................... B05C 11/08 134/104.1 |
| 2004/0200509 A1 | 10/2004 | Felder et al. |

(Continued)

OTHER PUBLICATIONS

Notice of Allowance dated Dec. 14, 2018 for U.S. Appl. No. 14/995,305.

(Continued)

*Primary Examiner* — Mikhail Kornakov
*Assistant Examiner* — Ryan L Coleman
(74) *Attorney, Agent, or Firm* — Eschweiler & Potashnik, LLC

(57) ABSTRACT

A cup wash disk for cleaning a photoresist process tool is provided. An upper plate is arranged over a lower plate to define a cavity between the upper and lower plates. The lower plate comprises peripheral openings in fluid communication with the cavity and arranged along a periphery of the lower plate. A plurality of shims is arranged between the upper and lower plates to space the upper and lower plates and to define slits between the upper and lower plates. The slits are in fluid communication with the cavity. A method for cleaning the photoresist process tool using the cup wash disk is also provided.

20 Claims, 6 Drawing Sheets

(56) References Cited

U.S. PATENT DOCUMENTS

2007/0119476 A1    5/2007  Hara et al.
2011/0000509 A1    1/2011  Chen et al.

OTHER PUBLICATIONS

Non-Final Office Action dated Jun. 3, 2019 for U.S. Appl. No. 16/360,354.
Final Office Action dated Jan. 8, 2020 for U.S. Appl. No. 16/360,354.
Notice of Allowance dated Mar. 18, 2020 for U.S. Appl. No. 16/360,354.

* cited by examiner

CUP WASH DISK WITH SHIMS

REFERENCE TO RELATED APPLICATION

This Application is a Continuation of U.S. application Ser. No. 16/360,354, filed on Mar. 21, 2019, which is a Divisional of U.S. application Ser. No. 14/995,305, filed on Jan. 14, 2016 (now U.S. Pat. No. 10,265,735, issued on Apr. 23, 2019). The contents of the above-referenced patent applications are hereby incorporated by reference in their entirety.

BACKGROUND

During the manufacture of integrated circuits (ICs), multi-step sequences of semiconductor manufacturing processes are performed to gradually form electronic circuits on semiconductor substrates. One such semiconductor manufacturing process is photolithography. Photolithography is a process for transferring a geometric pattern from a photomask to a photoresist layer using radiation. The process includes depositing the photoresist layer, exposing the photoresist layer to radiation that passes through and is patterned by the photomask, and developing the photoresist layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
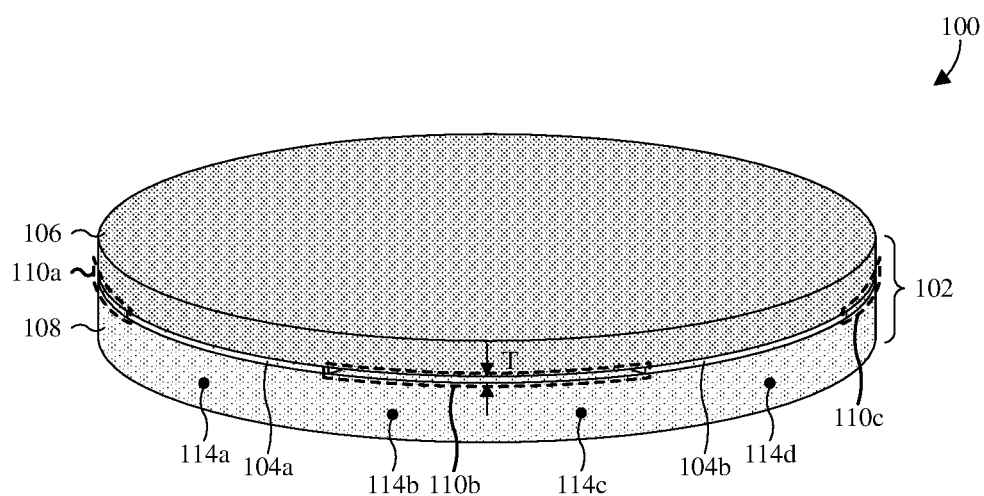
FIG. 1 illustrates a perspective view of some embodiments of a cup wash disk (CWD) with shims.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some processes for the deposition of a photoresist layer involve the application of a liquid photoresist material to a surface of a spinning workpiece. While the spinning promotes a uniform application of the liquid photoresist material, the spinning may also result in the splashing and/or spraying of the liquid photoresist material and the buildup of the liquid photoresist material on surfaces of a process chamber accommodating the spinning workpiece. The buildup may, in turn, lead to contamination of other workpieces placed in the process chamber. One solution is to clean the process chamber between uses.

To clean the process chamber, a cup wash disk (CWD) is placed within the process chamber. The CWD may comprise an upper plate arranged over and abutting a lower plate to define a cavity between the upper and lower plates. The lower plate comprises a lower opening on a bottom of the lower plate and a plurality of peripheral openings arranged along a periphery of the lower plate. The lower opening and the peripheral openings are in fluid communication with the cavity, and the lower opening is configured to receive a solvent. After placing the CWD within the process chamber, the CWD is spun while a solvent is sprayed into the lower opening from under the CWD. Due to centrifugal force, the solvent travels within the cavity to the peripheral openings, and splashes and/or sprays onto surfaces of the process chamber. The solvent then dissolves the buildup and cleans the process chamber.

While the CWD facilitates cleaning of the process chamber, the CWD may fail to effectively clean an outer sidewall (or cup) of the process chamber for certain designs of the process chamber. For example, the process chamber may comprise an inner sidewall (or cup) obstructing the lateral spray of solvent to the outer sidewall. Where the CWD fails to effectively clean the outer sidewall, the time it takes to clean the process chamber and/or the amount of solvent used to clean the process chamber may increase, thereby increasing costs.

The present application is directed to a CWD with shims arranged between upper and lower plates that define a cavity. The lower plate comprises peripheral openings arranged along a periphery of the lower plate and in fluid communication with the cavity. Further, the lower plate comprises a lower opening in fluid communication with the cavity. The shims space the lower and upper plates, and define a plurality of slits between the lower and upper plates. The slits are arranged over the peripheral openings, along a periphery of the upper and lower plates, and are in fluid communication with the cavity. Advantageously, the slits increase a height of a lateral spray of solvent from the CWD during use of the CWD. Such increased height may allow the lateral spray to reach an outer sidewall of a process chamber unimpeded by an inner sidewall of the process chamber. As such, the CWD may be effective at cleaning the outer sidewall, thereby saving solvent, money, and time during cleaning.

With reference to FIG. 1, a perspective view 100 of some embodiments of a CWD 102 with shims 104a, 104b is provided. As illustrated, the shims 104a, 104b are arranged between an upper plate 106 and a lower plate 108 to define slits 110a, 110b, 110c between the upper and lower plates 106, 108. The shims 104a, 104b are confined to a periphery of the upper and lower plates 106, 108 and, in some embodiments, are evenly spaced around the periphery of the upper and lower plates 106, 108. Further, in some embodiments, the shims 104a, 104b directly abut the upper and lower plates 106, 108. The shims 104a, 104b may be, for example, Teflon (e.g., polytetrafluoroethylene), and/or the shims 104a, 104b and the slits 110a, 110b, 110c may have a thickness T of about 0.1 millimeters.

The upper and lower plates 106, 108 define a cavity (not shown) therebetween that is in fluid communication with the slits 110a, 110b, 110c. The cavity comprises a recess (not shown) in a lower surface of the upper plate 106 and/or a recess (not shown) in an upper surface of the lower plate 108. The upper and/or lower plates 106, 108 comprise peripheral openings 114a, 114b, 114c, 114d in fluid communication with the cavity and arranged along a periphery of the upper and/or lower plates 106, 108. In some embodiments, the peripheral openings 114a, 114b, 114c, 114d are evenly spaced laterally around the periphery of the upper and/or lower plates 106, 108, and/or restricted to the lower plate 108. Further, the lower plate 108 comprises a lower opening (not shown) in fluid communication with the cavity. In some embodiments, the upper and lower plates 106, 108 share a circular footprint and/or sidewall surfaces of the upper and lower plates 106, 108 are coplanar.

In use, the CWD 102 is placed on a workpiece support within a chamber of a photoresist process tool that is configured to deposit photoresist. The CWD 102 is then rotated through the workpiece support while a stream of solvent is sprayed into the cavity through the lower opening. Centrifugal force moves or accelerates the solvent to the periphery of the CWD 102 where it sprays out the slits 110a, 110b, 110c and the peripheral openings 114a, 114b, 114c, 114d to surfaces of the chamber. Upon interfacing with the surfaces, the solvent dissolves any buildup of photoresist on the surfaces, thereby cleaning the chamber. Advantageously, the slits 110a, 110b, 110c may be elevated relative to the peripheral openings 114a, 114b, 114c, 114d, such that the slits 110a, 110b, 110c may provide effective cleaning of surfaces that cannot be reached by solvent spraying out of the peripheral openings 114a, 114b, 114c, 114d. This advantageously allows efficient use of solvent, low cost, and quick cleaning.

Figure 2A:
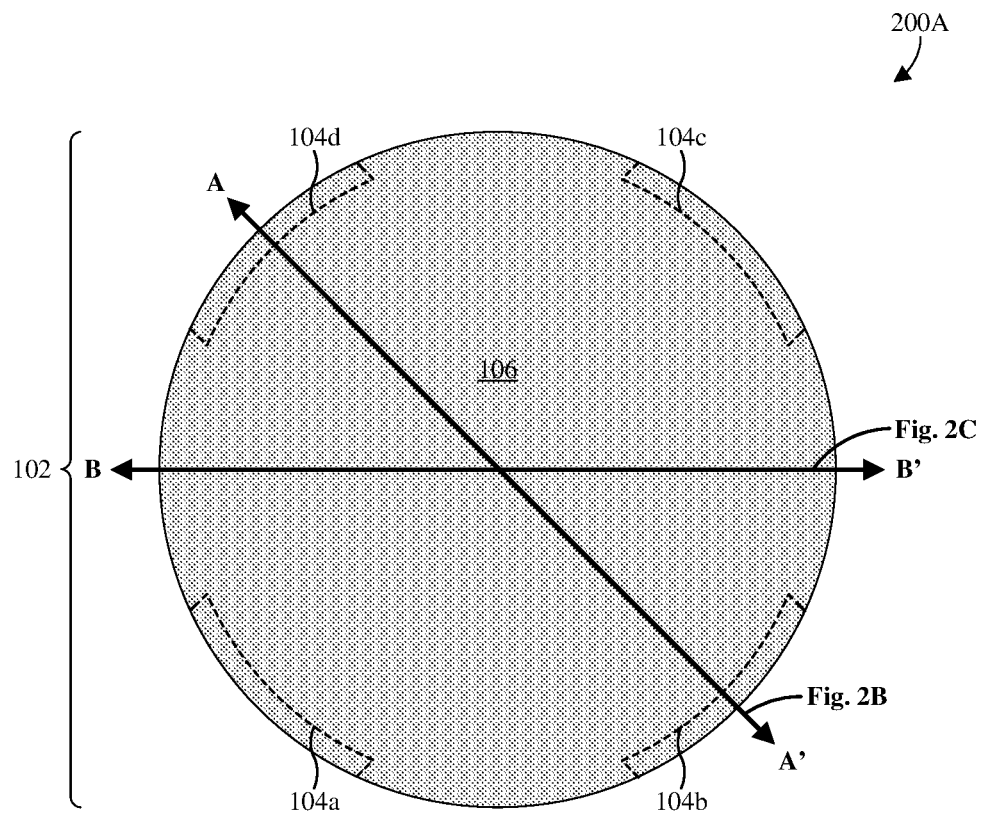
FIG. 2A illustrates a top view of some embodiments of the CWD of FIG. 1.

With reference to FIG. 2A, a top view 200A of some embodiments of the CWD 102 of FIG. 1 is provided. As illustrated, a plurality of shims 104a, 104b, 104c, 104d (shown in phantom) are arranged under an upper plate 106 and laterally spaced around a periphery of the upper plate 106. For example, the shims 104a, 104b, 104c, 104d may comprise four shims laterally spaced evenly around a periphery of the upper plate 106.

Figure 2B:
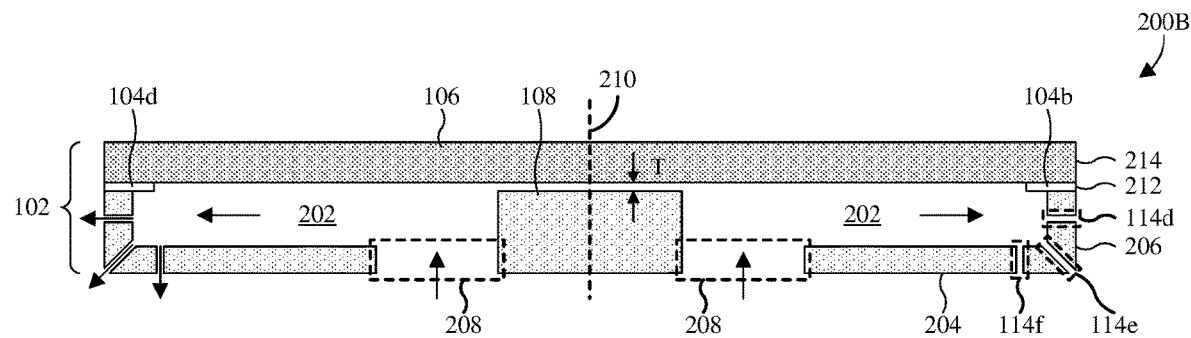
FIGS. 2B and 2C illustrate various cross-sectional views of some embodiments of the CWD of FIG. 2A.

With reference to FIG. 2B, a cross-sectional view 200B of some embodiments of the CWD 102 of FIG. 2A is provided. The cross-sectional view 200B is taken along line A-A' in FIG. 2A. As illustrated, a cavity 202 is arranged between upper and lower plates 106, 108 and comprises a recess in the lower plate 108 and/or the upper plate 106. In some embodiments, the cavity 202 is ring shaped.

The upper and/or lower plates 106, 108 comprise peripheral openings 114d, 114e, 114f (only some of which are labeled) in fluid communication with the cavity 202 and arranged along a periphery of the upper and/or lower plates 106, 108. The peripheral openings 114d, 114e, 114f may be, for example, horizontal, vertical, or angled upward or downward. In some embodiments, the peripheral openings 114d, 114e, 114f comprise a vertical peripheral opening 114f extending vertically to the cavity 202 through a bottom surface 204 of the lower plate 108. In some embodiments, the peripheral openings 114d, 114e, 114f comprise a horizontal peripheral opening 114d extending laterally to the cavity 202 through an outer sidewall surface 206 of the lower plate 108. In some embodiments, in some embodiments, the peripheral openings 114d, 114e, 114f comprise an angled peripheral opening 114e extending upward at about 45 degrees to horizontal, through a lower corner of the lower plate 108, to the cavity 202. Further, the lower plate 108 comprises a lower (or bottom) opening 208 in fluid communication with the cavity 202 and configured to receive solvent (shown by arrows). In some embodiments, the lower opening 208 is ring shaped, and/or laterally spaced between a central axis 210 of the CWD 102 and the peripheral openings 114d, 114e, 114f. Further, in some embodiments, the lower opening 118 is arranged on the bottom surface 204 of the lower plate 108.

A plurality of shims 104b, 104d are arranged between the upper and lower plates 106, 108 to space the upper plate 106 from the lower plate 108. The shims 104b, 104d are laterally spaced along the periphery of the upper plate 106 to define slits (not shown) between the upper and lower plates 106, 108. In some embodiments, outer sidewall surfaces 212 of the shims 104b, 104d (only one of which is labeled) are coplanar with the outer sidewall surface 206 of the lower plate 108 and/or an outer sidewall surface 214 of the upper plate 106. The slits are in fluid communication with the cavity 202 and provide an outlet for solvent entering the cavity 202. In some embodiments, the shims 104b, 104d have a thickness T of about 0.1 millimeters.

Figure 2C:
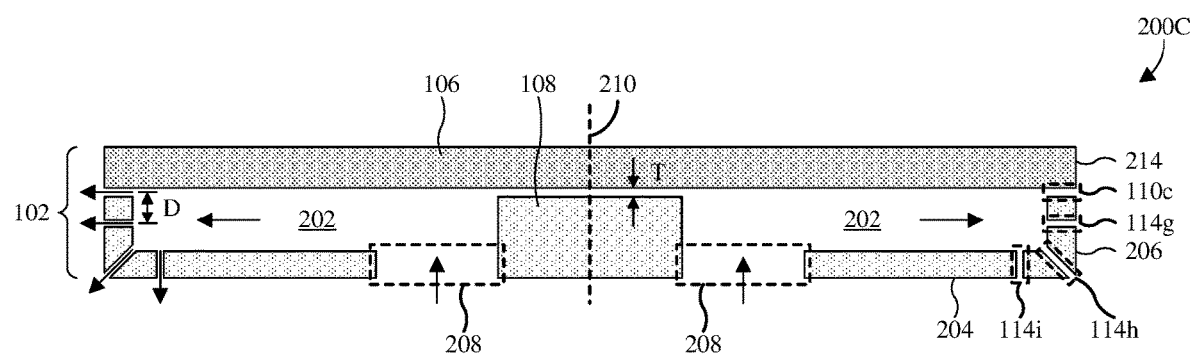

With reference to FIG. 2C, another cross-sectional view 200C of some embodiments of the CWD 102 of FIG. 2A is provided. The cross-sectional view 200C is taken along line B-B' in FIG. 2A. As illustrated, a plurality of peripheral openings 114g, 114h, 114i (only some of which are labeled) are arranged along a periphery of a lower plate 108 in fluid communication with a cavity 202 between the lower plate 108 and an upper plate 106. Further, shims (not shown) are arranged between the upper and lower plates 106, 108 to define slits 110c (only one of which is labeled). The slits 110c are in fluid communication with the cavity 202 and are arranged along a periphery of the upper and lower plates 106, 108, vertically between the upper and lower plates 106, 108 and laterally between the shims. In some embodiments, the slits 110c are arranged over the peripheral openings 114g, 114h, 114i. For example, the slits 110c may be spaced over the peripheral openings 114g, 114h, 114i by a distance D of about 3 millimeters. Further, in some embodiments, the slits 110c are arranged in direct fluid communication with the cavity 202. The slits 110c and the peripheral openings 114g, 114h, 114i provide outlets for solvent (shown by arrows) entering the cavity 202.

Figure 3A:
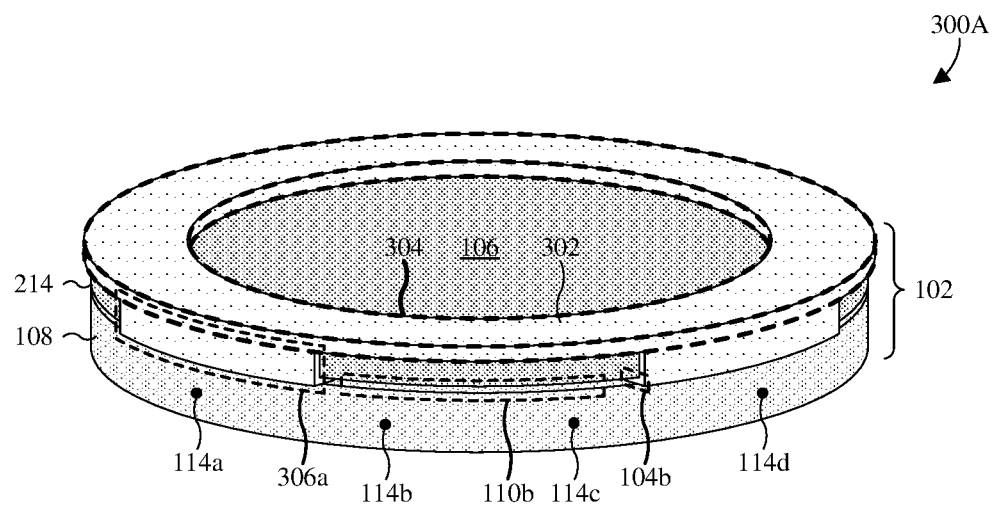
FIG. 3A illustrates a perspective view of more detailed embodiments of the CWD of FIG. 1.

With reference to FIG. 3A, a perspective view 300A of more detailed embodiments of the CWD 102 of FIG. 1 is provided. As illustrated, a shim structure 302 is arranged on an upper plate 106 to space the upper plate 106 from a lower plate 108. In some embodiments, the shim structure 302 is Teflon (e.g., polytetrafluoroethylene) or some other polymer, and/or is molded. The shim structure 302 comprises a ring-shaped region 304, a plurality of shims 104b, and a plurality of flexible members 306a. For ease of illustration, only one of the shims 104a and one of the flexible members 306a are labeled.

The ring-shaped region 304 is arranged over the upper plate 106. In some embodiments, the ring-shaped region 304 is arranged directly on the upper plate 106, and/or has an outer diameter exceeding that of the upper plate 106. The shims 104b are arranged between the upper and lower plates 106, 108 to define slits 110b between the upper and lower plates 106, 108. For ease of illustration, only one of the slits 110b is labeled. The shims 104b are confined to a periphery of the upper and lower plates 106, 108 and, in some embodiments, are laterally spaced evenly around the periphery of the upper and lower plates 106, 108. The flexible members 306a extend between outer edges of the shims 104b and the ring-shaped region 304, along an outer sidewall surface 214 of the upper plate 106, to connect the shims 104b to the ring-shaped region 304. In some embodiments, a length of the flexible members 306a is about equal to a thickness of the upper plate 106, and/or the flexible members 306a directly abut the outer sidewall surface 214 of the upper plate 106. The flexible members 306a are flexible to deflect away from sidewall surface 214 so as to add the shim structure 302 to the upper plate 106, or to remove the shim structure 302 from the upper plate 106.

Figure 3B:
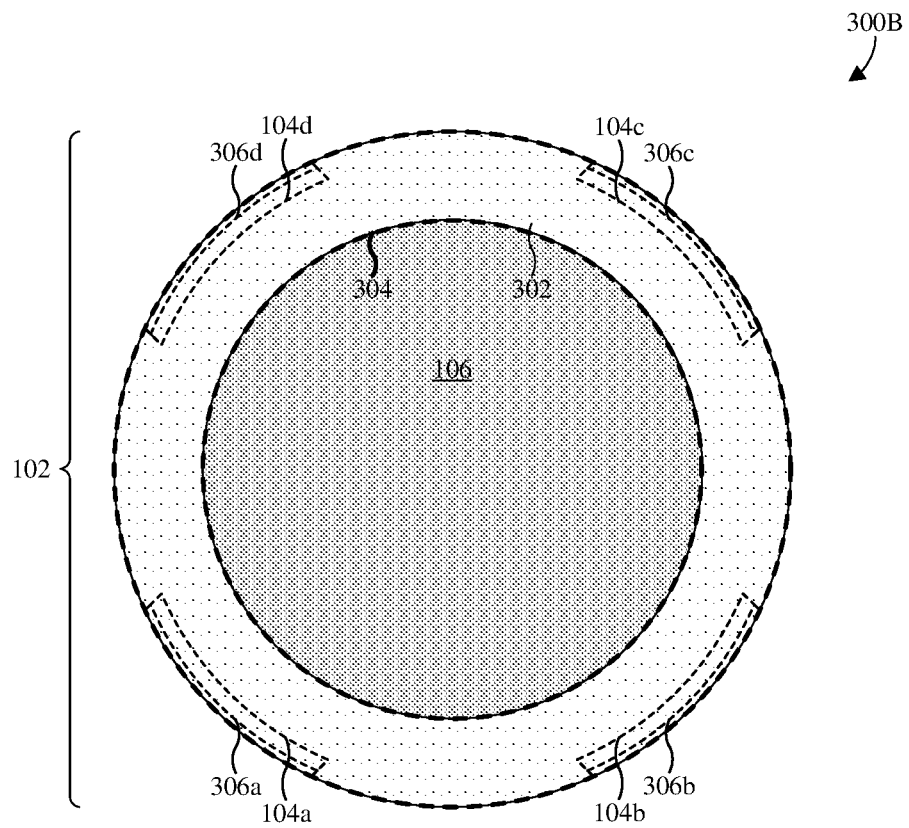
FIG. 3B illustrates a top view of some embodiments of the CWD of FIG. 3A.

With reference to FIG. 3B, a top view 300B of some embodiments of the CWD 102 of FIG. 3A is provided. As illustrated, a ring-shaped region 304 of a shim structure 302 partially covers an upper plate 106. Further, a plurality of shims 104a, 104b, 104c, 104d (shown in phantom) are arranged under the upper plate 106 and laterally spaced around a periphery of the ring-shaped region 304. For example, the shims 104a, 104b, 104c, 104d may comprise four shims laterally spaced evenly around a periphery of the ring-shaped region 304. The shims 104a, 104b, 104c, 104d are connected to the ring-shaped region 304 by respective flexible members 306a, 306b, 306c, 306d (also shown in phantom) that are laterally spaced around the periphery of the ring-shaped region 304 with the shims 104a, 104b, 104c, 104d.

Figure 4:
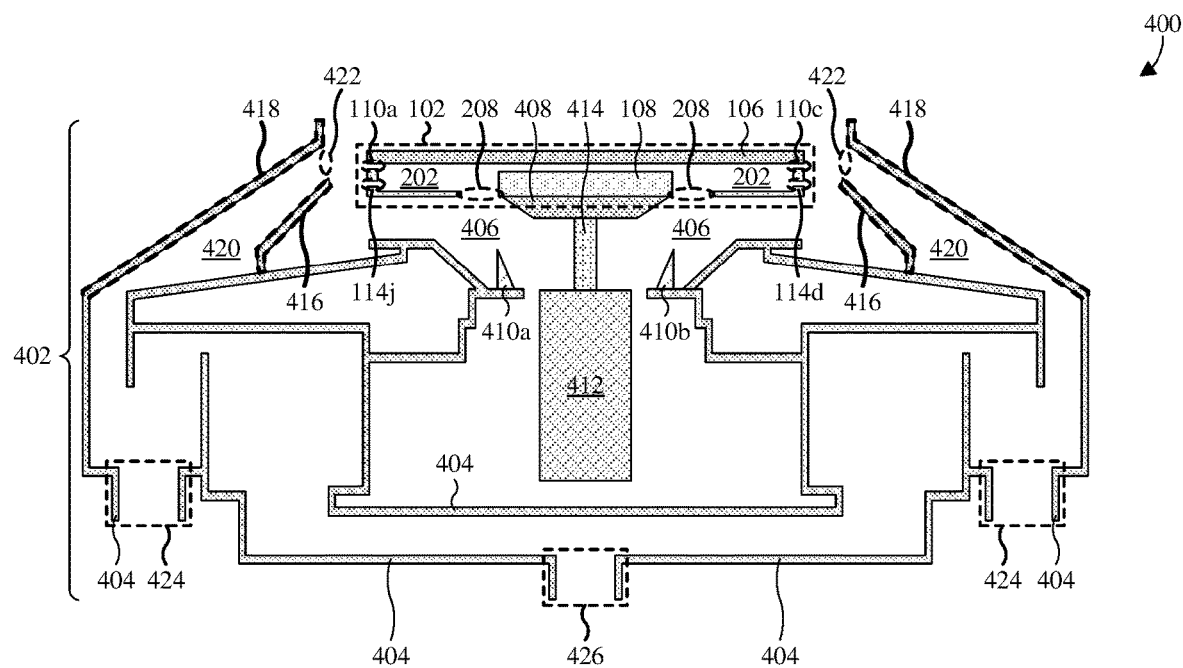
FIG. 4 illustrates a cross-sectional view of some embodiments of the CWD of FIG. 1 arranged in a photoresist process tool.

With reference to FIG. 4, a cross-sectional view 400 of some embodiments of the CWD 102 of FIG. 1 arranged in a photoresist process tool 402 is provided. The photoresist process tool 402 is configured to deposit photoresist, such as liquid photoresist, on workpieces (not shown), and the CWD 102 is configured to spray solvent to clean the photoresist process tool 402 of excess photoresist between depositions.

As illustrated, the CWD 102 is arranged in a housing 404 of the photoresist process tool 402 and comprises a cavity 202 arranged between upper and lower plates 106, 108. The upper and/or lower plates 106, 108 comprise peripheral openings 114d, 114j in fluid communication with the cavity 202 and arranged along a periphery of the upper and/or lower plates 106, 108. Further, the lower plate 108 comprises a lower (or bottom) opening 208 in fluid communication with the cavity 202. Shims (not shown) are arranged between the upper and lower plates 106, 108 to define slits 110a, 110c along a periphery of the CWD 102, laterally between the shims and vertically between the upper and lower plates 106, 108.

A chamber 406 of the housing 404 accommodates a workpiece support 408 and back rinse nozzles 410a, 410b. The workpiece support 408 comprises an upper side configured to support the CWD 102 or a workpiece (not shown), and further comprises a lower side mechanically coupled to a motor 412 through a shaft 414. The motor 412 is configured to rotate the workpiece support 408 through the shaft 414. The back rinse nozzles 410a, 410b are configured to spray a solvent into the lower opening 208 of the CWD 102. The chamber 406 is partially defined by an inner sidewall (or cup) 416 and an outer sidewall (or cup) 418 laterally surrounding the workpiece support 408. The inner sidewall 416 protrudes to a first height above the workpiece support 408, and the outer sidewall 418 protrudes to a second height above the workpiece support 408 that is greater than the first height. Further, the outer sidewall 418 laterally surrounds and is laterally spaced from the inner sidewall 416.

An exhaust channel 420 of the housing 404 is configured to remove excess photoresist and/or solvent from the chamber 406. In some embodiments, the exhaust channel 420 is arranged under and along a periphery of the chamber 406, and/or laterally surrounds the chamber 406. The exhaust channel 420 extends from an inlet 422 abutting the chamber 406 to one or more outlets 424, 426 underlying the inlet 422. The inlet 422 is arranged on an upper side of the housing 404 between the inner and outer sidewalls 416, 418. Further, in some embodiments, the inlet 422 laterally surrounds the chamber 406 along a periphery of the housing 404 (e.g., is ring shaped). The outlet(s) 424, 426 comprise a photoresist outlet 424 for excess photoresist and/or a solvent outlet 426 for excess solvent. In some embodiments, the photoresist outlet 424 is arranged on a lower side of the housing 404 and/or laterally encloses the chamber 406 along a periphery of the housing 404 (e.g., is ring shaped). Further, in some embodiments, the solvent outlet 426 is arranged directly under the chamber 406, downstream from the photoresist outlet 424. To prevent photoresist from moving along the exhaust channel 420 from the photoresist outlet 424 to the solvent outlet 426, the exhaust channel 420 may move up and then down between the photoresist and solvent outlets 424, 426. Due to the increased density of photoresist relative to solvent, the photoresist is unable to move upward with the solvent.

During cleaning of the photoresist process tool 402, the back rinse nozzles 410a, 410b spray solvent into the lower opening 208 of the CWD 102 while the CWD 102 is rotated by the motor 412. Centrifugal force moves or accelerates the solvent to a periphery of the CWD 102 where it sprays out of the peripheral openings 114d, 114j of the CWD 102 and the slits 110a, 110c of the CWD 102. Advantageously, the slits 110a, 110c may allow the outer sidewall 418 to be effectively cleaned. For example, where solvent spraying out of the peripheral openings 114d, 114j towards the outer sidewall 418 is obstructed by the inner sidewall 416, solvent spraying out of the slits 110a, 110c towards the outer sidewall 418 may reach the outer sidewall 418 unimpeded by the inner sidewall 416 since the slits 110a, 110c may be arranged over the peripheral openings 114d, 114j and a topmost point of the inner sidewall 416. By effectively cleaning the outer sidewall 418, solvent, time, and money are saved.

With reference to FIGS. 5-8, a series of cross-sectional views of some embodiments of a method for using a photoresist process tool, and subsequently cleaning the photoresist process tool with a CWD comprising shims, is provided.

Figure 5:
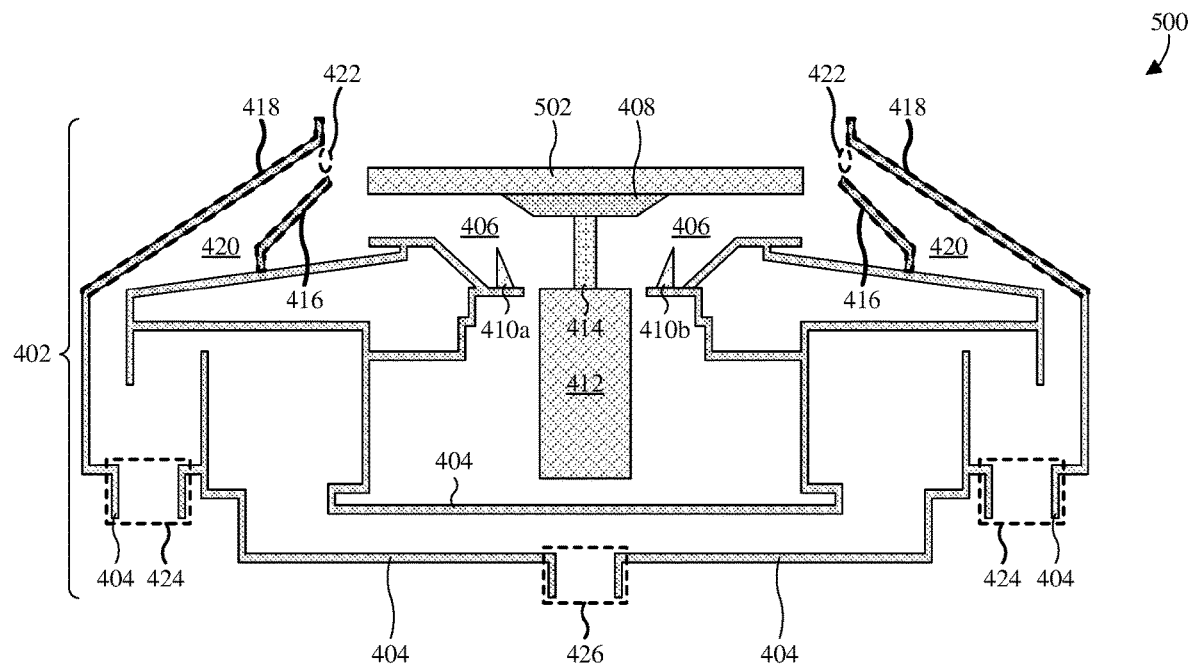
FIGS. 5-8 illustrate a series of cross-sectional views of some embodiments of a method for using a photoresist process tool, and subsequently cleaning the photoresist process tool with a CWD comprising shims.

As illustrated by the cross-sectional view 500 of FIG. 5, a workpiece 502 is placed in a chamber 406 of a photoresist process tool 402 on a workpiece support 408 of the photoresist process tool 402. The workpiece 502 may be, for example, a semiconductor wafer or substrate with or with one or more layers and/or devices arranged thereon. The semiconductor wafer or substrate may be, for example, a bulk semiconductor substrate, such as a bulk silicon substrate, or a silicon-on-insulator (SOI) substrate.

Figure 6:
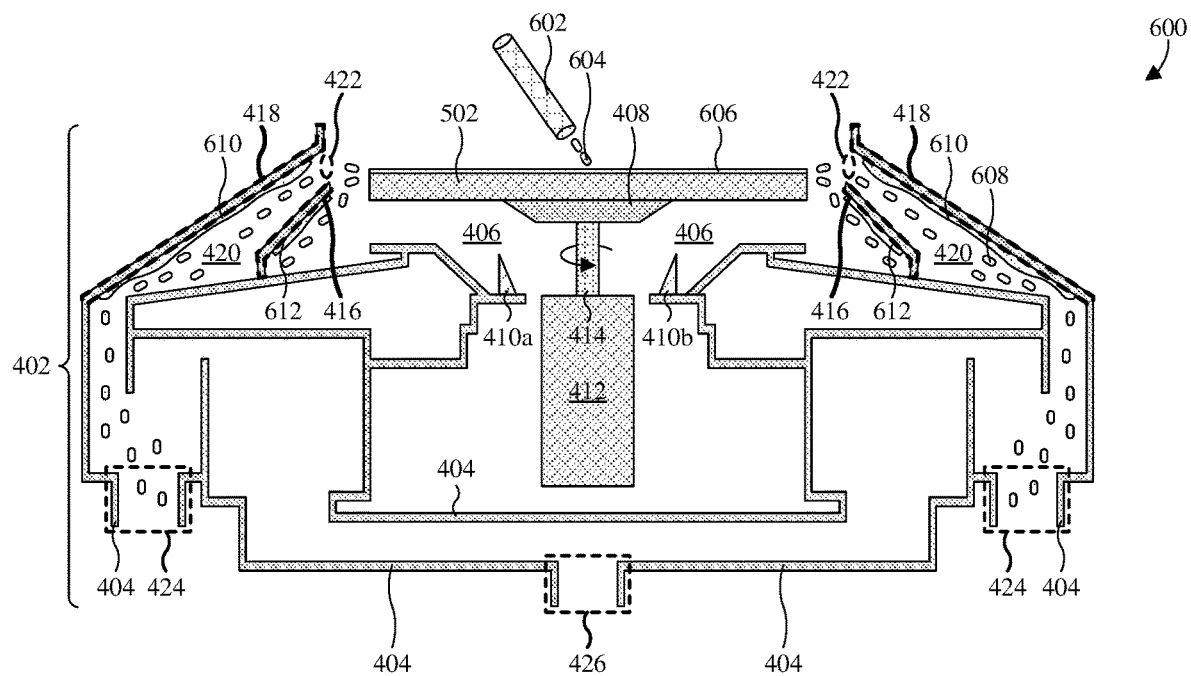

As illustrated by the cross-sectional view 600 of FIG. 6, a photoresist nozzle 602 is arranged over the workpiece 502 and the workpiece 502 is rotated by a motor 412 through the workpiece support 408. With the workpiece 502 rotating, the photoresist nozzle 602 applies photoresist 604 to the workpiece 502 to form a photoresist layer 606 on the workpiece 502. In some embodiments, the photoresist nozzle 602 applies the photoresist 604 to the center of the workpiece 502, and/or the photoresist 604 is applied in liquid form. Due to centrifugal force, the applied photoresist 604 distributes evenly across the workpiece 502, thereby forming the photoresist layer 606 with a substantially uniform thickness. Further, excess photoresist 608 splashes and/or sprays off the workpiece 502. Some of the excess photoresist 608 moves to an inlet 422 of an exhaust channel 420 around a periphery of the chamber 406, and is subsequently removed from the photoresist process tool 402. Further, some of the excess photoresist 608 builds up on inner and outer sidewalls 416, 418 partially defining the chamber 406 to form excess photoresist layers 610, 612 on the inner and outer sidewalls 416, 418.

Figure 7:
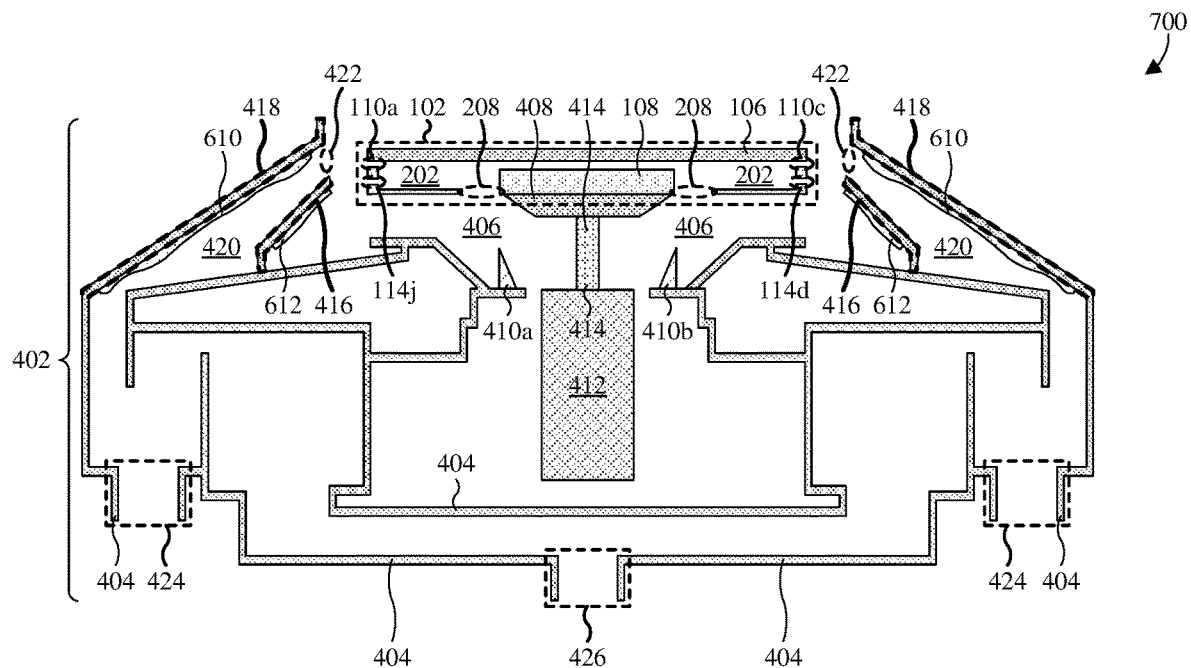
Figure 8:
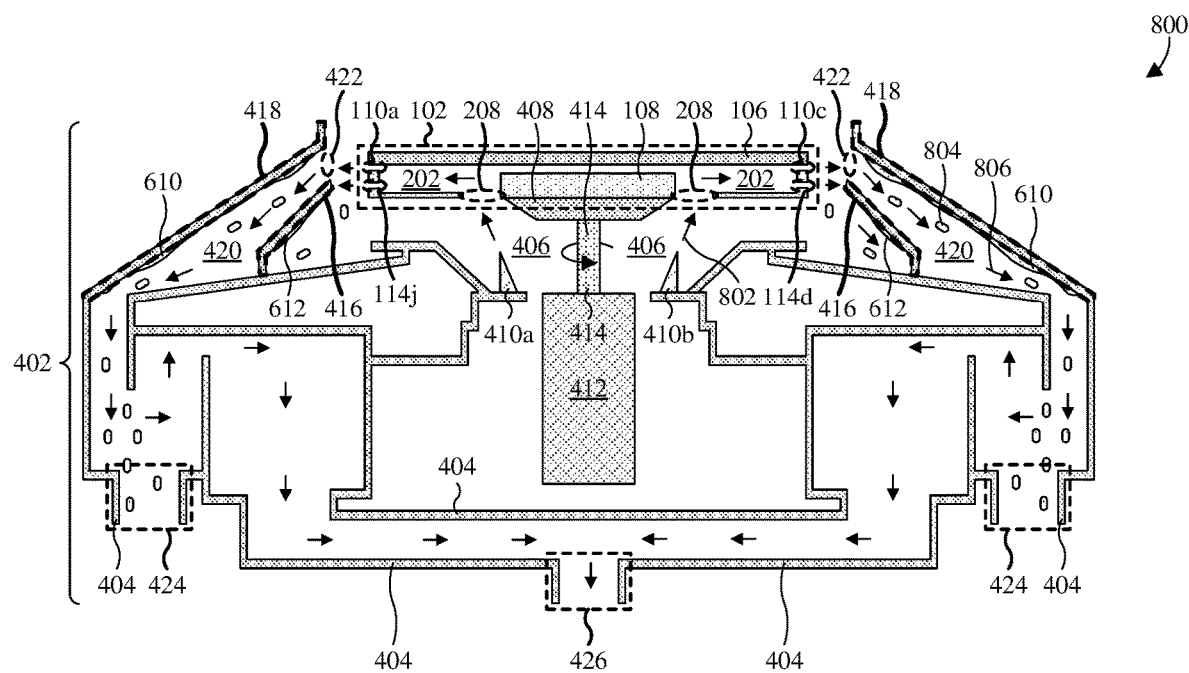

As illustrated by the cross-sectional view 700 of FIG. 7, the workpiece 502 (see, for example, FIG. 6) is replaced with a CWD 102. In other words, the photoresist nozzle 602 (see, for example, FIG. 6) is removed from over the chamber 406 and the workpiece 502 is removed from the chamber 406. Further, the CWD 102 is placed in the chamber 406 on the workpiece support 408. The CWD 102 comprises an upper plate 106 and a lower plate 108 arranged under the upper plate 106. The upper and lower plates 106, 108 are spaced from one another by shims (not shown) arranged therebetween to define slits 110a, 110c laterally spaced along a periphery of the upper and/or lower plates 106, 108.

As illustrated by the cross-sectional view 800, the CWD 102 is rotated by the motor 412 while back rinse nozzles 410a, 410b spray solvent 802 (shown as arrows) into a cavity 202 of the CWD 102 through a lower (or bottom) opening 208 of the CWD 102. Due to centrifugal force, the solvent 802 moves and/or accelerates through the cavity 202 to peripheral openings 114d, 114j of the CWD 102 and the slits 110a, 110c, and concurrently sprays out the peripheral openings 114d, 114j and the slits 110 towards the inner and outer sidewalls 416, 418. Upon interfacing with the inner and outer sidewalls 416, 418, the solvent 802 dissolves the excess photoresist layers 610, 612 that built up on the inner and outer sidewalls 416, 418 during photoresist deposition. Dissolved photoresist 804 and excess solvent 806 move to the inlet 422 of the exhaust channel 420 and respectively travel to a photoresist outlet 424 and a solvent outlet 426 for removal from the photoresist process tool 402.

In some embodiments, the back rinse nozzles 410a, 410b continue spraying the solvent 802 until the excess photoresist layers 610, 612 are completely removed and/or until a predetermined period of time has elapsed. Further, in some embodiments, solvent spraying out of the peripheral openings 114d, 114j towards the outer sidewall 418 is obstructed by the inner sidewall 416, whereas solvent spraying out of the slits 110a, 110c passes to the outer sidewall 418 unobstructed by the inner sidewall 416 since the slits 110a, 110c are arranged above the peripheral openings 114d, 114j and a topmost point of the inner sidewall 416. In such embodiments, the CWD 102 advantageously allows efficient cleaning of the chamber 406, which reduces solvent usage, time, and costs.

Figure 9:
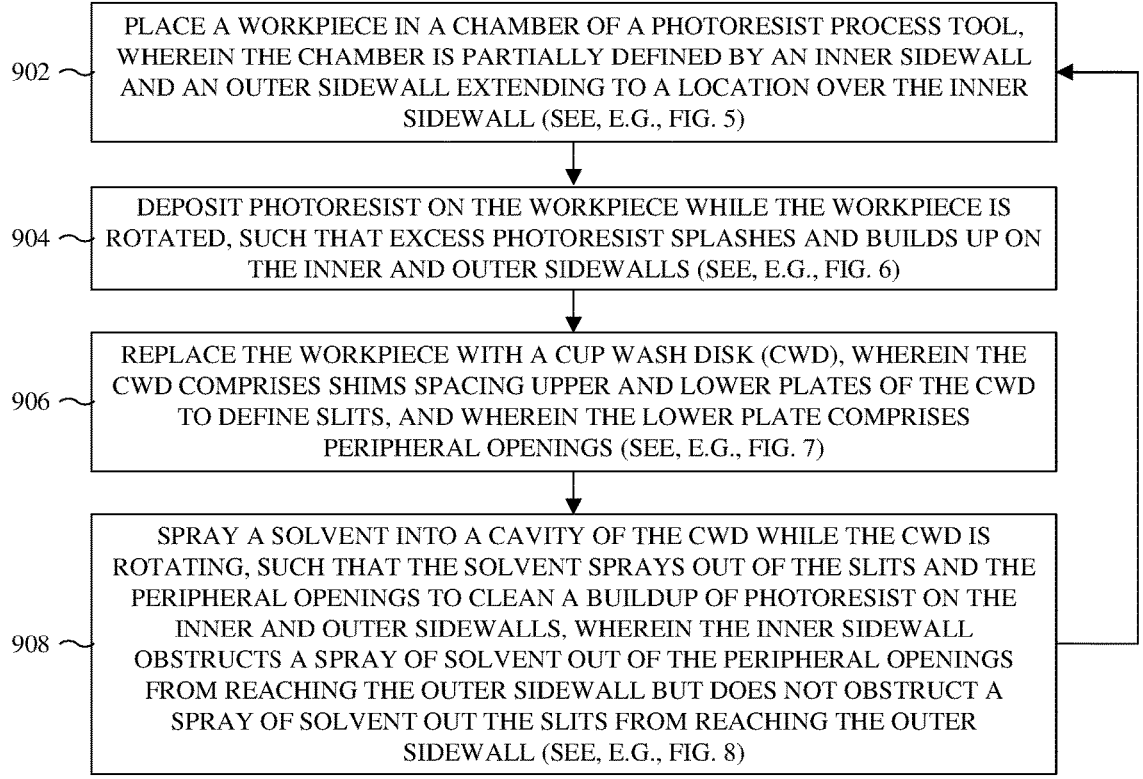
FIG. 9 illustrates a flowchart of some embodiments of a method for using a photoresist process tool, and subsequently cleaning the photoresist process tool with a CWD comprising shims.

With reference to FIG. 9, a flowchart 900 of some embodiments of a method for using a photoresist process tool, and subsequently cleaning the photoresist process tool with a CWD comprising shims, is provided.

At 902, a workpiece is placed in a chamber of a photoresist process tool. The chamber is partially defined by an inner sidewall and an outer sidewall extending to a location over the inner sidewall. See, for example, FIG. 5.

At 904, photoresist is deposited on the workpiece while the workpiece is rotated, such that excess photoresist splashes and builds up on the inner and outer sidewalls. See, for example, FIG. 6.

At 906, the workpiece is replaced with a CWD. The CWD comprises shims spacing upper and lower plates of the CWD to form slits. Further, the lower plate comprises peripheral openings. See, for example, FIG. 7.

At 908, a solvent is sprayed into a cavity of the CWD while the CWD is rotating, such that the solvent sprays out of the slits and the peripheral openings to clean a buildup of photoresist on the inner and outer sidewalls. The inner sidewall obstructs a spray of solvent out of the peripheral openings from reaching the outer sidewall but does not obstruct a spray of solvent out the slits from reaching the outer sidewall. See, for example, FIG. 8.

While the method described by the flowchart 900 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Thus, as can be appreciated from above, the present disclosure provides a cup wash disk for cleaning a photoresist process tool. An upper plate is arranged over a lower plate to define a cavity between the upper and lower plates. The lower plate comprises peripheral openings in fluid communication with the cavity and arranged along a periphery of the lower plate. A plurality of shims is arranged between the upper and lower plates to space the upper and lower plates and to define slits between the upper and lower plates. The slits are in fluid communication with the cavity.

In other embodiments, the present disclosure provides a method for cleaning a photoresist process tool. A cup wash disk is placed in a chamber of a photoresist process tool. The cup wash disk comprises shims arranged between an upper plate and a lower plate to define a plurality of slits between the upper and lower plates. The cup wash disk is rotated while spraying solvent into a cavity of the cup wash disk from below the cup wash disk. The cavity is defined between the upper and lower plates and is in fluid communication with the slits. The solvent moves through the cavity to the slits to spray the solvent out the slits towards sidewalls of the chamber.

In yet other embodiments, the present disclosure provides a photoresist process tool. A workpiece support is arranged in a chamber. A cup wash disk is arranged on the workpiece support. The cup wash disk comprises an upper plate and a lower plate stacked upon one another and spaced by a plurality of shims arranged between the upper and lower plates. The shims are laterally spaced along a periphery of the cup wash disk.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photoresist process tool comprising:
a workpiece support arranged in a chamber; and
a cup wash disk (CWD) on the workpiece support and comprising an upper plate, a lower plate, and a plurality of shims, wherein the upper plate overlies the lower plate and is separated from the lower plate by a cavity and the shims, wherein the shims are spaced along a periphery of the CWD to define a plurality of slits in fluid communication with the cavity, and
wherein the cavity has a first height and a second height respectively at the shims and a center of the CWD, and wherein the second height is non-zero and less than the first height.

2. The photoresist process tool according to claim 1, wherein the first and second heights extend from a lower surface of the upper plate respectively to a first upper surface of the lower plate and a second upper surface of the lower plate, and wherein the first and second upper surfaces are at different elevations above the workpiece support.

3. The photoresist process tool according to claim 1, wherein the upper plate completely covers the cavity.

4. The photoresist process tool according to claim 1, wherein the first height is adjacent to the shims and extends along sidewalls of the shims, wherein the cavity has a third height directly under the shims, and wherein the third height is different than and between the first and second heights.

5. The photoresist process tool according to claim 1, wherein the plurality of shims comprises a first shim and a second shim respectively on opposite sides of the cavity, and wherein a lower surface of the upper plate extends continuously from the first shim to the second shim while crossing the center of the CWD.

6. The photoresist process tool according to claim 1, wherein the CWD is symmetrical about a vertical axis at the center of the CWD.

7. The photoresist process tool according to claim 1, wherein the lower plate defines a back-rinse opening leading into the cavity, and wherein the photoresist process tool further comprises:
a back-rinse nozzle underlying the CWD and configured to spray solvent into the cavity through the back-rinse opening.

8. A photoresist process tool comprising:
a workpiece support arranged in a chamber; and
a cup wash disk (CWD) on the workpiece support and comprising a first plate, a second plate, and a plurality of spacer structures, wherein the first and second plates are vertically stacked and separated from each other by a cavity and the spacer structures, wherein the spacer structures are spaced along a periphery of the CWD, wherein the spacer structures individually wrap around a corner of the first plate from a surface of the first plate facing the second plate to a sidewall of the first plate, and
wherein the spacer structures individually extend along the sidewall of the first plate from a top of the first plate to a bottom of the first plate.

9. The photoresist process tool according to claim 8, wherein the spacer structures have L-shaped profiles.

10. The photoresist process tool according to claim 8, wherein the CWD further comprises a ring-shaped structure vertically stacked with the first and second plates, and wherein the spacer structures extend along the sidewall of the first plate from the ring-shaped structure to the corner of the first plate.

11. The photoresist process tool according to claim 10, wherein the ring-shaped structure and the spacer structures are integrated together.

12. The photoresist process tool according to claim 10, wherein the first and second plates are circular and have individual diameters less than that of the ring-shaped structure.

13. The photoresist process tool according to claim 8, wherein the spacer structures define a plurality of slits spaced along the periphery of CWD and in fluid communication with the cavity, wherein the CWD has a back-rinse opening leading into the cavity and configured to receive a solvent while spun by the workpiece support, and wherein the CWD is configured to expel the solvent through the slits while spun by the workpiece support.

14. The photoresist process tool according to claim 8, wherein the CWD further comprises a spacer-support structure vertically stacked with the first and second plates, wherein the spacer structures extend along the sidewall of the first plate from the spacer-support structure to the corner of the first plate, and wherein the spacer-support structure is on an opposite side of the first plate as the surface of the first plate.

15. A photoresist process tool comprising:
a workpiece support arranged in a chamber; and
a cup wash disk (CWD) on the workpiece support and comprising an upper plate, a lower plate, and a plurality of shims, wherein the upper plate overlies the lower plate and is separated from the lower plate by a cavity and the shims, wherein the shims are spaced along a peripheral sidewall of the CWD to define a plurality of slits in fluid communication with the cavity, and wherein the shims overhang the cavity;
wherein the plurality of shims comprises a first shim, wherein the first shim and the lower plate have a first vertical separation offset from the slits and in the cavity, wherein the upper plate and the lower plate have a second vertical separation at a center of the CWD and in the cavity, and wherein the second vertical separation is a non-zero value less than the first vertical separation.

16. The photoresist process tool according to claim 15, wherein the lower plate has a first sidewall and a second sidewall respectively facing the cavity and facing away from the cavity, wherein a separation between the first and second sidewalls is less than a width of the shims.

17. The photoresist process tool according to claim 15, wherein the shims and the upper plate define a top surface of the cavity, and wherein the top surface of the cavity has a stepped profile at the shims.

18. The photoresist process tool according to claim 15, wherein the upper plate, the lower plate, and the first shim define a common sidewall that is straight from top to bottom.

19. The photoresist process tool according to claim 15, wherein top surfaces respectively of the shims directly contact a bottom surface of the upper plate, and wherein bottom surfaces respectively of the shims directly contact a top surface of the lower plate.

20. The photoresist process tool according to claim 15, wherein the upper plate completely covers the cavity.

* * * * *